United States Patent
Gabl et al.

(10) Patent No.: US 8,304,963 B2
(45) Date of Patent: Nov. 6, 2012

(54) PIEZOACTUATOR WITH A PREDETERMINED BREAKING LAYER

(75) Inventors: Reinhard Gabl, St. Peter (AT); Alexander Glazunov, Deutschlandsberg (AT); Georg Kuegerl, Eibiswald (AT); Martin Galler, Graz (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 13/017,741

(22) Filed: Jan. 31, 2011

(65) Prior Publication Data

US 2011/0181155 A1 Jul. 28, 2011

Related U.S. Application Data

(63) Continuation of application No. PCT/EP2009/059966, filed on Jul. 31, 2009.

(30) Foreign Application Priority Data

Aug. 1, 2008 (DE) .......................... 10 2008 035 924
Oct. 23, 2008 (DE) .......................... 10 2008 052 914

(51) Int. Cl.
*H01L 41/083* (2006.01)
(52) U.S. Cl. ...................................... 310/328; 310/366
(58) Field of Classification Search ................. 310/328, 310/366
See application file for complete search history.

(56) References Cited

U.S. PATENT DOCUMENTS

| | | | |
|---|---|---|---|
| 7,358,655 B2 | 4/2008 | Ragossnig et al. | |
| 7,449,077 B2 | 11/2008 | Heinzmann et al. | |
| 2009/0289527 A1 | 11/2009 | Hirschler et al. | |
| 2010/0141098 A1* | 6/2010 | Doellgast et al. | 310/363 |
| 2010/0194247 A1 | 8/2010 | Döllgast et al. | |
| 2010/0230623 A1 | 9/2010 | Boecking | |
| 2010/0237751 A1 | 9/2010 | Bosch et al. | |
| 2010/0326405 A1 | 12/2010 | Nakamura | |
| 2010/0327704 A1 | 12/2010 | Sakamoto et al. | |

FOREIGN PATENT DOCUMENTS

| | | |
|---|---|---|
| DE | 10 2006 026 644 A1 | 12/2007 |
| DE | 10 2006 035 634 A1 | 4/2008 |
| DE | 10 2007 037 500 A1 | 11/2008 |
| DE | 102007037500 A1 * | 11/2008 |
| DE | 10 2007 041 079 A1 | 3/2009 |
| EP | 1 764 844 A1 | 3/2007 |
| WO | WO 03/105246 A2 | 12/2003 |
| WO | WO 2004/077583 A1 | 9/2004 |
| WO | WO 2008/017655 A1 | 2/2008 |
| WO | WO 2008/047460 A1 | 4/2008 |
| WO | WO 2008/072767 A1 | 6/2008 |
| WO | WO 2008/072768 A1 | 6/2008 |
| WO | WO 2009/082006 A1 | 7/2009 |
| WO | WO-2009-092584 A1 * | 7/2009 |

* cited by examiner

*Primary Examiner* — Thomas Dougherty
(74) *Attorney, Agent, or Firm* — Slater & Matsil, L.L.P.

(57) ABSTRACT

A piezoactuator of multilayer design includes piezoelectric layers and electrode layers to form a stack. A predetermined breaking layer for the targeted origination and guiding of cracks is introduced between two adjacent electrode layers. The predetermined breaking layer has a barrier region, in which the formation of continuous electrically conductive paths or the formation of cracks leading through the barrier region is impeded.

15 Claims, 5 Drawing Sheets

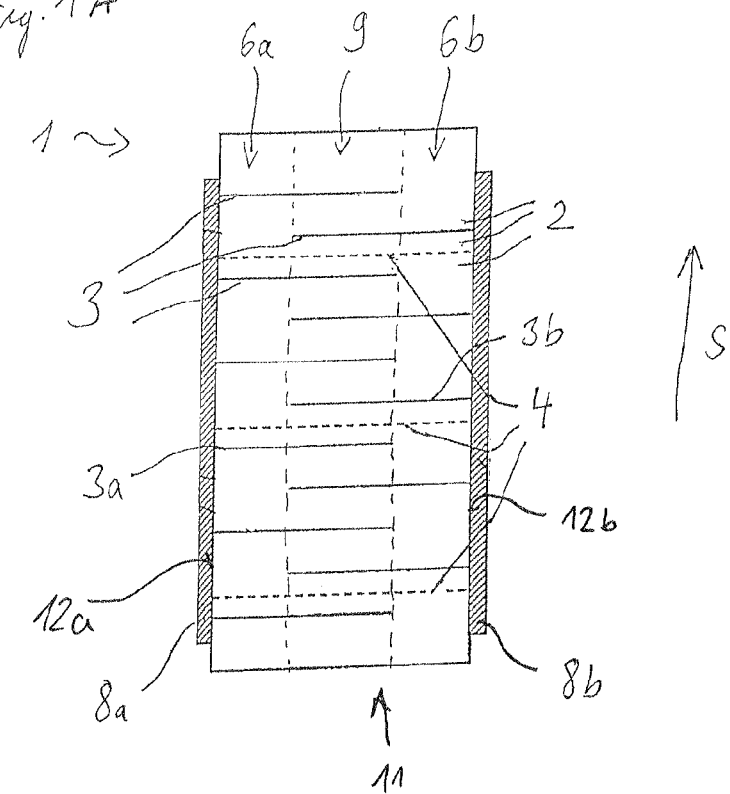
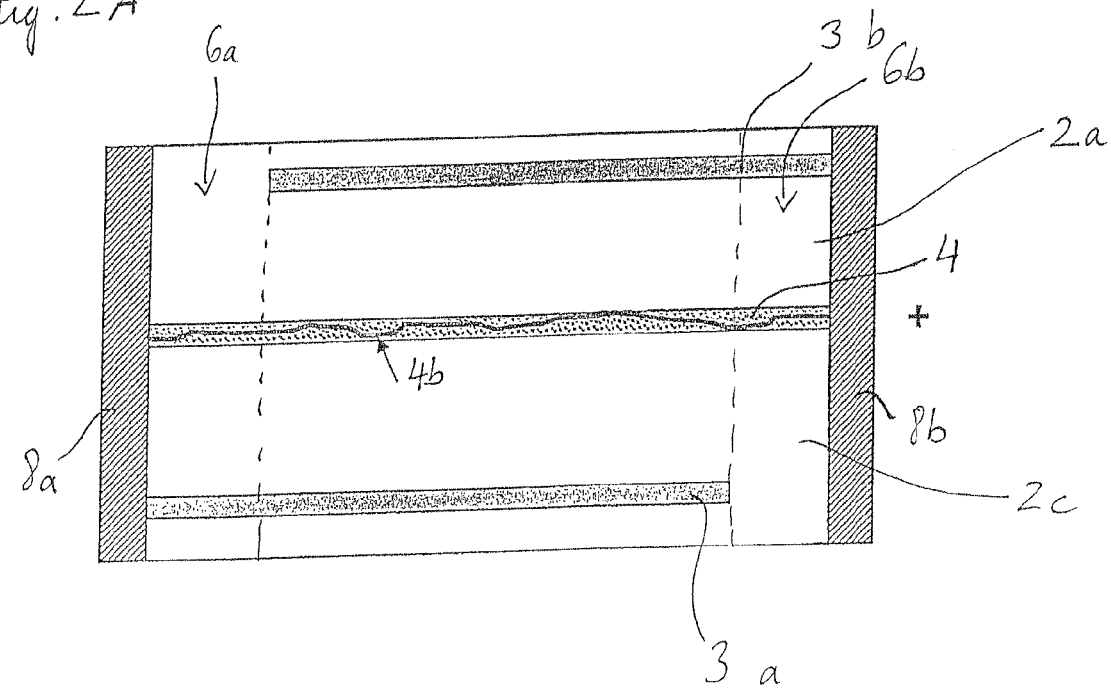

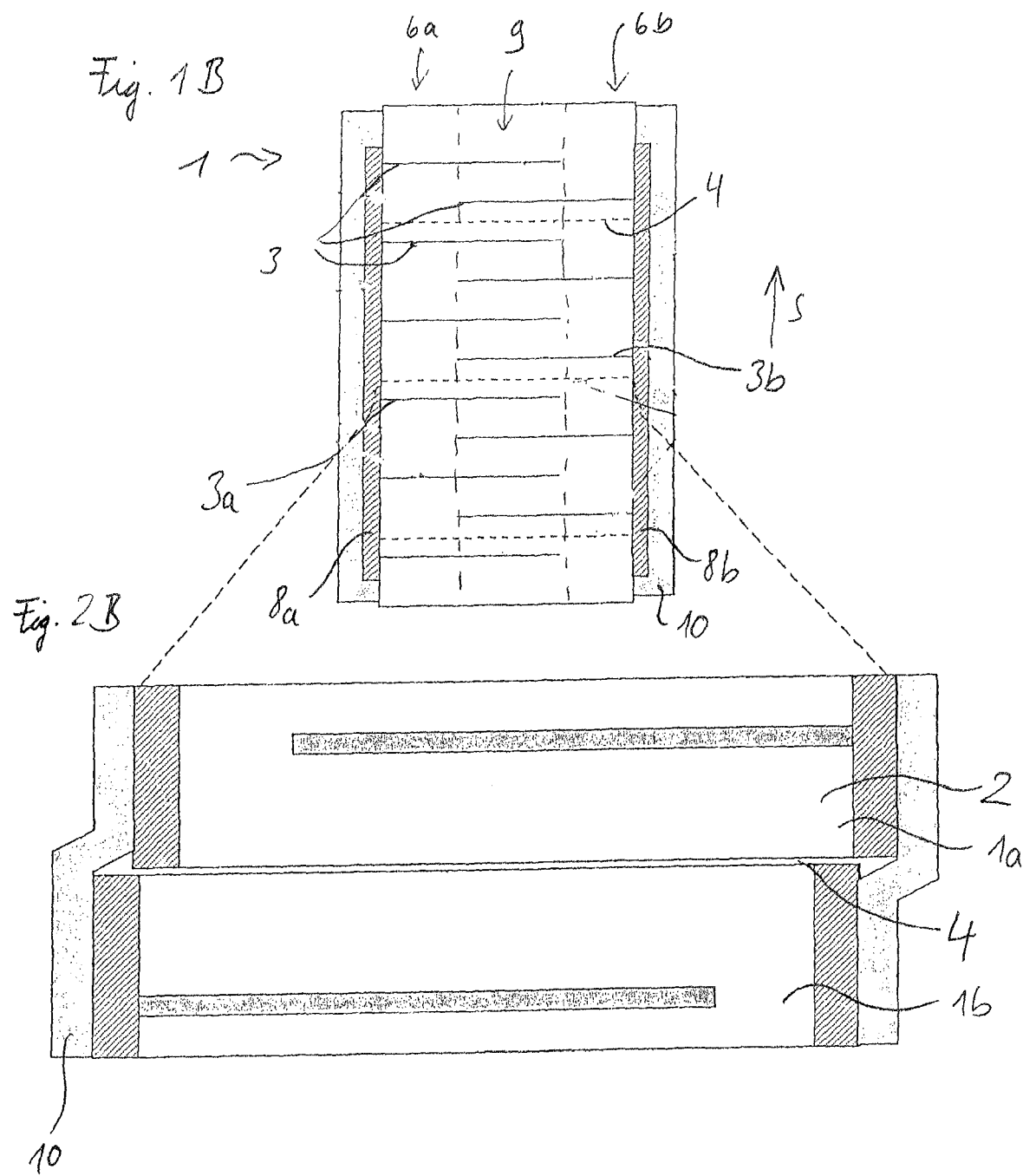

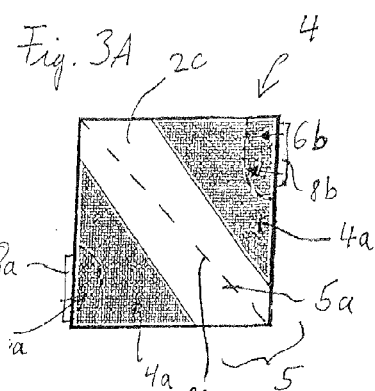
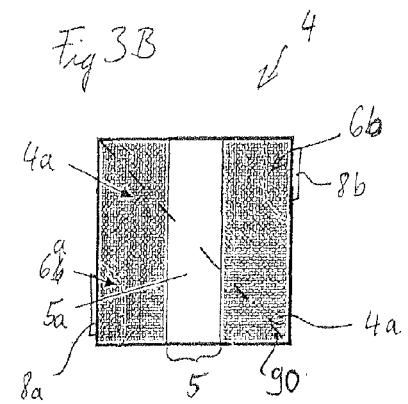
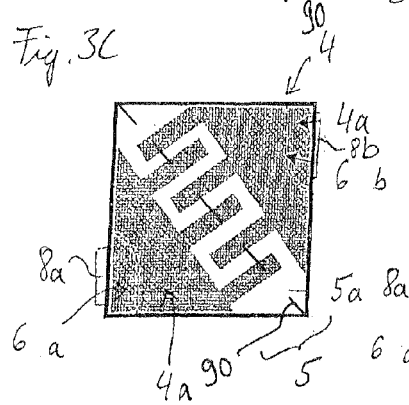
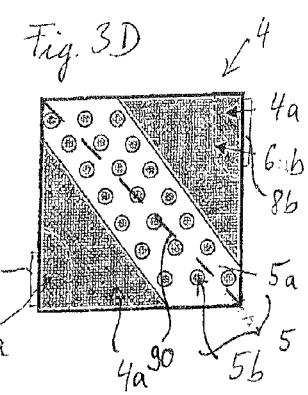
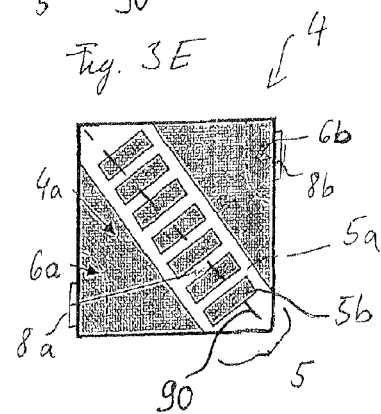
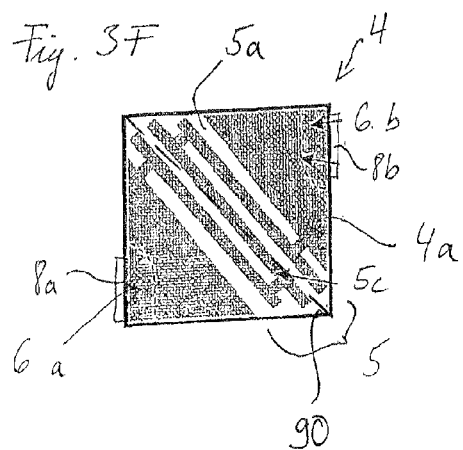

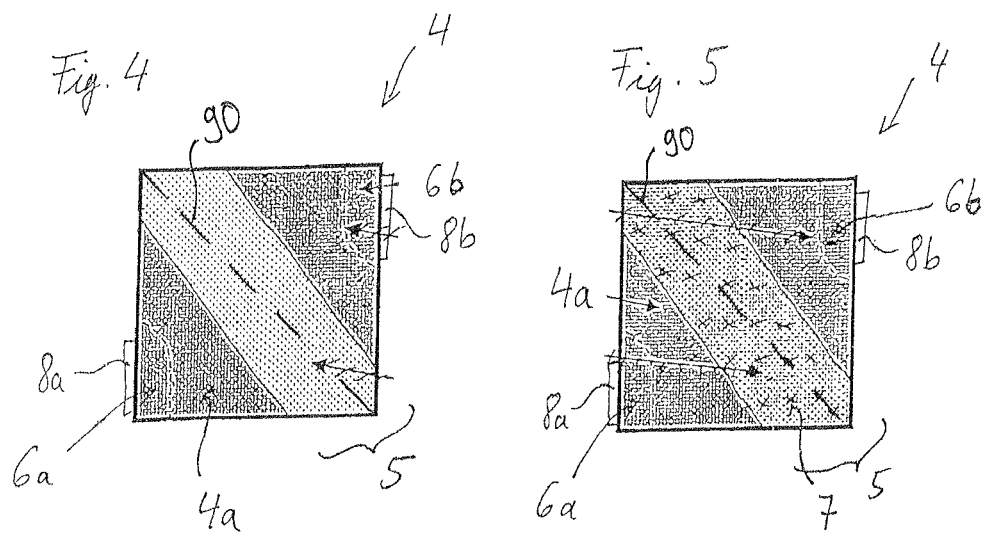
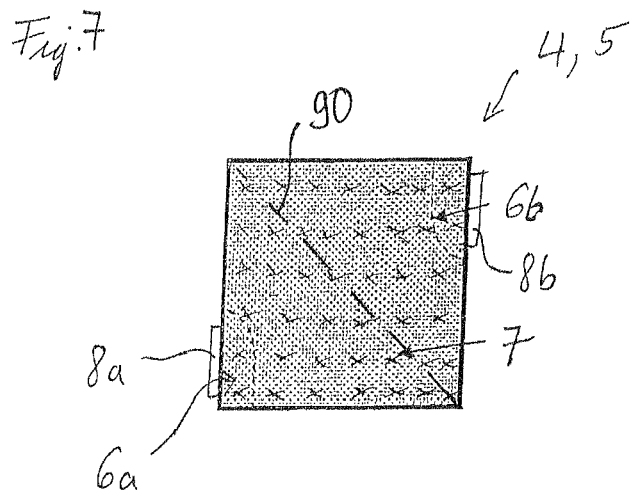

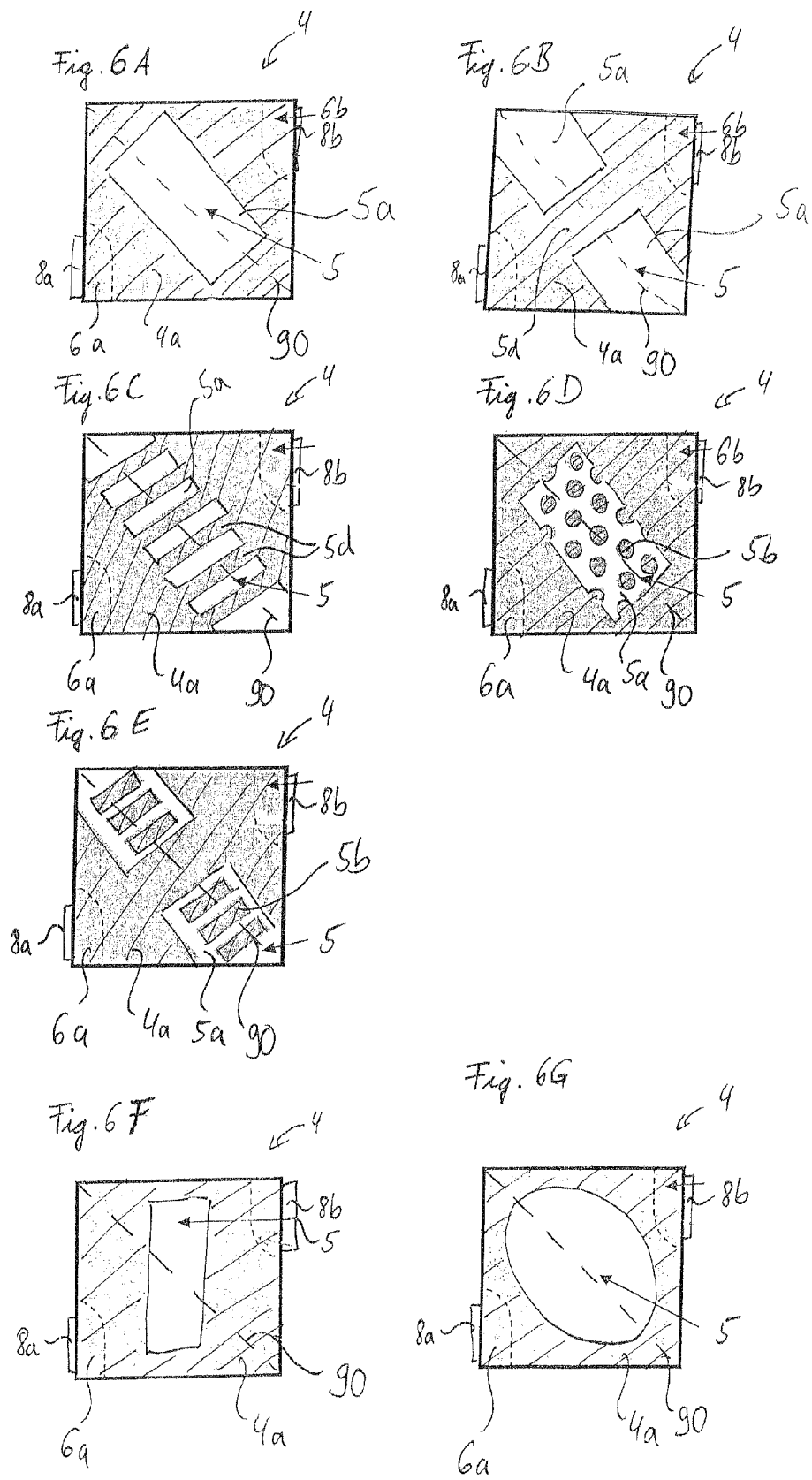

PIEZOACTUATOR WITH A PREDETERMINED BREAKING LAYER

This application is a continuation of co-pending International Application No. PCT/EP2009/059966, filed Jul. 31, 2009, which designated the United States and was not published in English, and which claims priority to German Application No. 10 2008 035 924.6, filed Aug. 1, 2008, and German Application No. 10 2008 052 914.1, filed Oct. 23, 2008, which applications are incorporated herein by reference.

TECHNICAL FIELD

A piezoactuator is specified, which is constructed from a multiplicity of piezoelectric layers with electrode layers lying therebetween. When an electrical voltage is applied to the electrode layers, the piezoelectric layers expand, as a result of which a stroke is generated. Piezoactuators of this type are used, for example, for actuating an injection valve in a motor vehicle.

BACKGROUND

Mechanical stresses can occur during operation of the piezoactuator, as a result of which cracks can arise. In particular, such stresses occur in the boundary region between so-called active zones and inactive zones, in which the piezoelectric layers expand to different extents. In order that cracks do not arise in an uncontrolled fashion in the stack and thus cause, for example, a short circuit between electrode layers of different polarities, the stacks are provided with predetermined breaking layers. The predetermined breaking layers are embodied such that cracks occur particularly easily in the predetermined breaking layers and propagate within the predetermined breaking layers.

The PCT document WO 2004/077583 A1 describes a piezoactuator having predetermined breaking layers.

SUMMARY OF THE INVENTION

In one embodiment, the invention provides a piezoactuator with a predetermined breaking layer which has an increased reliability with respect to failure of the piezoactuator.

A piezoactuator of multilayer design is specified, wherein piezoelectric layers and electrode layers arranged therebetween are arranged to form a stack.

Preferably, the piezoactuator is a monolithic multilayer actuator produced from thin films of a piezoelectric material, for example, lead zirconate titanate (PZT). In order to form the electrode layers, a metal paste, for example, a silver-palladium paste or a copper-containing paste, can be applied to the films by means of a screen printing method. The films are subsequently stacked, pressed and jointly sintered. In this case, an electrode layer need not be applied to every piezoelectric layer. By way of example, a plurality of piezoelectric layers can be situated between two electrode layers.

Preferably, external electrodes are applied on two opposite outer areas of the piezoactuator. An external electrode comprises a base metallization, by way of example, which can be produced by means of a stoving paste analogously to the electrode layers. The electrode layers are connected to the external electrodes alternately, for example, along the stacking direction of the piezoactuator. For this purpose, the electrode layers are led, for example, alternately to one of the external electrodes and at a distance from the second external electrode. In this way, the electrode layers of one polarity are electrically connected to one another via a common external electrode.

In one embodiment, the piezoactuator has an enclosure. The enclosure can protect the piezoactuator against external influences, e.g., ingress of moisture, or prevent mechanical damage. By way of example, the enclosure covers the external electrodes and is applied on side areas of the piezoactuator. Preferably, the enclosure contains an elastic material.

The piezoactuator specified has a predetermined breaking layer the tear strength of which is at least in part lower than the tear strength of adjoining piezoelectric layers. By way of example, the tensile strength of the predetermined breaking layer is at least in part less than ⅔ of the tensile strength of the composite assembly comprising the piezoelectric layers and electrode layers.

In one embodiment, the predetermined breaking layer is configured inhomogeneously laterally, i.e., in a plane perpendicular to the stacking direction.

Preferably, the predetermined breaking layer has at least one partial region that differs from a further region of the predetermined breaking layer with regard to its chemical or physical properties. By way of example, the material in the partial region differs from the material in the further region of the predetermined breaking layer with regard to its chemical composition or its inner structure.

Such an inhomogeneous configuration makes it possible to impede, for example, the origination of conductive paths or the origination of a segmentation of the piezoactuator. In this case, the partial region can be regarded as a barrier region or part of a barrier region.

Such a barrier region impedes the formation of electrically conductive paths leading through the barrier region. As an alternative or in addition thereto, the formation of cracks leading through the barrier region can be impeded in the barrier region. *

Short circuits between electrode layers of different polarities which are adjacent in the stacking direction are intended to be prevented by the insertion of a predetermined breaking layer.

In order for the piezoactuator to expand when a voltage is applied to the electrode layers the piezoelectric layers should be polarized. For this purpose, by way of example, a DC voltage is applied via the external electrodes between adjacent electrode layers and the stack is heated. In inactive zones in which adjacent electrode layers of different polarities do not overlap in the stacking direction, the piezoelectric material does not expand or expands only partly in the same direction as in the active zones. As a result of the different expansion of the piezoelectric layers in active and inactive zones, mechanical stresses arise, which can lead to cracks during polarization or during operation of the piezoactuator.

The insertion of a predetermined breaking layer makes it possible to control the cracking in a targeted manner, such that cracks originate only in the predetermined breaking layer and then also propagate within the predetermined breaking layer. As a result, the cracks run in a plane perpendicular to the stacking direction and therefore cannot lead to a short circuit between adjacent electrode layers of different polarities.

In one preferred embodiment, the predetermined breaking layer has at least in part a greater average porosity than an adjoining piezoelectric layer.

By way of example, the predetermined breaking layer contains a piezoelectric material, the porosity of which is greater than the porosity of an adjoining piezoelectric layer. A greater porosity can be produced, for example, by additives being introduced into a basic material, the additives producing voids during the sintering process. By way of example, the voids arise as a result of the additive being evaporated. By way of example, the predetermined breaking layer is formed by a porous ceramic layer.

In one embodiment, the predetermined breaking layer contains a metal such as, for example, silver, palladium, copper or an alloy of the metals. In this case, the composition of the metal can be chosen such that diffusion occurs during the sintering of the piezoactuator, as a result of which pores likewise arise in the predetermined breaking layer. By way of example, the predetermined breaking layer runs within a metallic layer comprising a material similar or identical to that of an electrode layer.

The mechanical strength of the predetermined breaking layer is preferably determined by the degree of porosity. If the predetermined breaking layer has a lower mechanical strength than the adjoining piezoelectric layers, then cracks preferably originate in the predetermined breaking layer and propagate within the predetermined breaking layer.

However, electrically conductive paths can originate in such predetermined breaking layers, for example, as a result of the ingress of water during operation in the case of high moisture or as a result of substances emerging from a passivation layer. This is critical particularly when a conductive path leads to the short circuit of the external electrodes. As a result, the operation of the piezoactuator is greatly impaired or it is even possible for failure of the device to occur.

Moreover, such predetermined breaking layers can promote a segmentation of the piezoactuator during operation. A segmentation can arise, for example, by virtue of a crack extending over the entire cross-sectional area of a piezoactuator, such that the piezoactuator is divided into two partial stacks. Such a segmentation can have the effect, for example, that the external contact-connection of the piezoactuator is interrupted. Moreover, a segmentation can lead to the origination of conductive paths between the external electrodes and hence a short circuit. If the piezoactuator has an enclosure, a segmentation can result in an increased mechanical loading of the enclosure and damage, e.g., tearing of the enclosure.

A barrier region in the predetermined breaking layer can prevent the origination of electrically conductive paths which electrically connect the external electrodes. For this purpose, the barrier region is configured in such a way that it impedes the formation of electrically conductive paths leading through the barrier region.

In addition or as an alternative thereto, the occurrence of a segmentation of the piezoactuator can be prevented by a barrier region in the predetermined breaking layer. For this purpose, the barrier region is configured in such a way that it impedes the formation of cracks leading through the barrier region.

Preferably, the barrier region is arranged in such a way that, within the predetermined breaking layer, each connecting line between the external electrodes passes through the barrier region. Correspondingly, within the predetermined breaking layer, each connecting line between the inactive zones passes through the barrier region.

In one embodiment, at least one partial region of the barrier region is provided in which the formation of electrically conductive paths or the formation of cracks is impeded to a greater extent than in a further region of the predetermined breaking layer.

The further region of the predetermined breaking layer has a lower tear strength than an adjoining piezoelectric layer. Preferably, this region lies at least in the region of the inactive zones.

By way of example, the partial region of the barrier region has a lower average porosity than the further region of the predetermined breaking layer.

This reduces the probability of conductive substances diffusing into the partial region and electrically conductive paths being formed. Given a suitable arrangement of the partial region in the barrier region, it is thus possible to prevent an electrically conductive path from leading through the barrier region.

Moreover, the lower average porosity leads to an increased tear strength, as a result of which a segmentation of the piezoactuator is made more difficult.

By way of example, the partial region contains the same material as an adjoining piezoelectric layer. In this case, the partial region can also be regarded as an interruption of the predetermined breaking layer. In order to produce such a layer, it is possible to apply a predetermined breaking layer to a piezoelectric layer which does not extend over the entire cross section of the piezoelectric layer. Preferably, the interruptions of the predetermined breaking layer are filled by the material of the adjoining piezoelectric layers during the pressing and sintering.

In one preferred embodiment, the predetermined breaking layer has no interruptions of this type, but rather has a lower tear strength than an adjoining layer of the stack over the entire cross section of the stack. In this case, the formation of electrically conductive paths or the formation of cracks can be impeded, for example, by a variation in the porosity of the predetermined breaking layer. In one embodiment, the porosity of the partial region of the barrier layer is greater than that of an adjoining piezoelectric layer and less than the porosity in a further region of the predetermined breaking layer.

In one embodiment, the barrier region has a continuous path, in which the tear strength is lower than in the partial region of the barrier region. The continuous path is preferably longer than that section of each straight line connecting the external electrodes which lies in the barrier region.

Ideally, the barrier layer is formed in such a way that electrically conductive paths or cracks can form in the barrier layer only along the continuous path. The longer the continuous path, the lower the probability of the path becoming conductive over its entire length, for example, as a result of the indiffusion of conductive substances, or of the path leading to a segmentation of the piezoactuator. Consequently, the probability of an electrically conductive path or a crack leading completely through the barrier layer is also lower, the longer the continuous path. By way of example, the continuous path contains the same material as the further region of the predetermined breaking layer.

In one embodiment, the material within the path is more porous than in the partial region of the barrier layer surrounding the path. Preferably, the continuous path is sinuous and is significantly longer than that section of each straight line connecting the external electrodes which lies in the barrier region, that is to say that its length is significantly greater than the width of the barrier layer.

Furthermore, such an embodiment has the advantage that a crack that has originated in the predetermined breaking layer can propagate well within the predetermined breaking layer in a plane perpendicular to the stacking direction of the electrode layers. This is intended to prevent the origination of a crack edge at which a crack present propagates into the adjoining piezoelectric layers.

In one preferred embodiment, the partial region of the barrier region is formed in such a way that, within the predetermined breaking layer, each connecting line between the external electrodes passes through the partial region.

By way of example, the partial region of the barrier region surrounds islands having a lower tear strength than the partial region.

Within the islands, cracks can originate in a targeted manner and a mechanical strain of the device can thus be prevented.

By way of example, the islands have a greater porosity than their surroundings. Preferably, the islands contain the same material as the further region of the predetermined breaking layer. The islands are formed in a circular fashion, for example, but they can also be formed in a rectangular fashion or have any other shape.

Preferably, at least one inactive zone is formed between two electrode layers of different polarities that are adjacent in a stacking direction, in which at least one inactive zone the electrode layers do not overlap in the stacking direction. In one preferred embodiment, the barrier region is situated outside the inactive zone.

Since, in exemplary embodiments of the piezoactuator, the greatest mechanical stresses occur in the region of the inactive zone, it is advantageous if the predetermined breaking layer is configured optimally there with regard to its ability with respect to crack formation and crack guiding. However, this can be accompanied by an increased probability of electrically conductive substances penetrating into the predetermined breaking layer. By way of example, electrically conductive substances penetrate into the predetermined breaking layer more easily in the case of an increased porosity.

In one embodiment, two separate inactive zones are formed between two adjacent electrode layers of different polarity.

By way of example, external electrodes are arranged on two opposite outer areas of the piezoactuator. The electrode layers are led in the stack direction alternately to one external electrode and are at a distance from the second external electrode. In this way, two separate inactive zones adjoining the external electrodes arise between two adjacent electrode layers of different polarities.

Furthermore, a piezoactuator with a predetermined breaking layer is specified wherein additives that impede the formation of electrically conductive paths or the formation of cracks are situated in the barrier region.

Such additives can be introduced into the predetermined breaking layer externally, for example, by doping of the material of the predetermined breaking layer, by printing or by diffusion. The additives bind, for example, penetrating substances or bring about a catalyst effect, such that the penetrating substances are converted into substances which do not lead to conductive paths. As an alternative or in addition thereto, the additives can lead to an increased tear strength of the barrier region.

In the case of a porous predetermined breaking layer, suitable additives can at least partly fill the pores.

In this way it is possible to prevent moisture or other electrically conductive substances from penetrating into the predetermined breaking layer and leading to the formation of an electrically conductive path. In addition or as an alternative thereto, it is possible to increase the tear strength in this region in this way.

In one embodiment, the barrier region is arranged at least in the outer edge region of the predetermined breaking layer. In this way, the predetermined breaking layer is outwardly sealed against penetrating moisture. In addition or as an alternative thereto, in this way the occurrence of cracks in the edge region of the piezoactuator can be made more difficult and mechanical stresses can thus be prevented.

In a further embodiment, the entire predetermined breaking layer constitutes a barrier region that impedes the formation of electrically conductive paths leading through the predetermined breaking layer. In this case, therefore, the barrier region extends over the entire predetermined breaking layer.

By way of example, additives that impede the formation of electrically conductive paths are introduced into a predetermined breaking layer, which can extend over the entire cross section of the piezoactuator, with a homogeneous concentration distribution.

BRIEF DESCRIPTION OF THE DRAWINGS

The piezoactuator specified and its advantageous configurations are explained below with reference to schematic figures that are not true to scale, in which:

FIG. 1A shows a longitudinal section through a piezoactuator,

FIG. 1B shows a longitudinal section through a piezoactuator with an enclosure,

FIG. 2A shows an excerpt from a longitudinal section through a piezoactuator with an electrically conductive path, FIG. 2B shows a perspective view of a segmented piezoactuator with an enclosure, FIGS. 3A, 3B, 3C, 3D, 3E and 3F show plan views of embodiments of predetermined breaking layers with barrier regions, FIG. 4 shows a plan view of a further embodiment of a predetermined breaking layer with a barrier region, FIG. 5 shows a plan view of a further embodiment of a predetermined breaking layer with a barrier region, FIGS. 6A, 6B, 6C, 6D, 6E, 6F and 6G show plan views of further embodiments of the weak-point layers, and FIG. 7 shows a plan view of a further embodiment of a predetermined breaking layer.

The following list of reference symbols may be used in conjunction with the drawings:
1 piezoactuator
11 stack
12a, 12b side area
2, 2a, 2b, 2c piezoelectric layer
3, 3a 3b electrode layer
4 predetermined breaking layer
4a further region
4b conductive path
5 barrier region
5a partial region of the barrier region
5b islands
5c continuous path
5d bridge
6a, 6b inactive zone
7 additive
8a, 8b external electrode
9 active zone
10 enclosure
S stacking direction

DETAILED DESCRIPTION OF ILLUSTRATIVE EMBODIMENTS

FIG. 1A shows a piezoactuator 1 of multilayer design, wherein a multiplicity of piezoelectric layers 2, for example, ceramic layers, are arranged one above another along a stacking direction S. Electrode layers 3 are arranged between some piezoelectric layers 2. A respective external electrode 8a, 8b is applied on opposite side areas 12a, 12b of the stack 11. In order to make electrical contact with the external electrodes 8a, 8b, leads can be soldered onto the external electrodes 8a, 8b (not shown). The electrode layers 3 are connected to the two external electrodes 8a, 8b alternately in the stacking direction S. For this purpose, an electrode layer 3a is alternately led to one of the external electrodes 8a, while it is spaced apart from the second external electrode 8b. The adjacent electrode layer 3b in the stacking direction S is electrically connected to the second external electrode 8b and spaced apart from the opposite external electrodes 8a. When a voltage is applied between the external electrodes 8a, 8b, the polarity of the electrode layers 3a, 3b thus alternates in the stack direction S.

The piezoelectric layers 2 expand along the field lines when a voltage is applied. The piezoactuator has inactive zones 6a, 6b, in which adjacent electrode layers of different polarities 3a, 3b in the stacking direction S have no overlap. Therefore piezoelectric layers 2 expand to a lesser extent in the inactive zones 6a, 6b than in an active zone 9, in which adjacent electrode layers of different polarities 3a, 3b overlap. This leads to mechanical stresses, as a result of which cracks can originate in the piezoactuator 1. For the targeted formation and guiding of the cracks, predetermined breaking layers 4 are arranged between adjacent electrode layers 3a, 3b.

FIG. 1B shows a piezoactuator 1 surrounded by an enclosure 10 at its side areas. The enclosure 10 covers the external electrodes 8a, 8b and protects them against external influences. By way of example, the enclosure 10 serves for protection against the ingress of moisture and against mechanical damage. The enclosure 10 contains an elastic material, for example silicone. The piezoactuator 1 has predetermined breaking layers 4 for the targeted formation and guiding of cracks.

FIG. 2A shows an excerpt from a longitudinal section through a piezoactuator 1, in which an electrically conductive path 4b has originated within a predetermined breaking layer 4. The predetermined breaking layer 4 contains a porous material and has a lower tear strength than the adjoining piezoelectric layers 2a, 2c. By way of example, the predetermined breaking layer 4 contains a ceramic material, the porosity of which is higher than the porosity of the adjoining piezoelectric layers 2a, 2c. By way of example the piezoelectric layers 2a, 2c likewise contain a ceramic material. On account of the increased porosity of the predetermined breaking layer 4, moisture can penetrate into the predetermined breaking layer 4 more easily than into adjoining piezoelectric layers 2a, 2c. As a result, an electrically conductive path 4b shown here can originate within the predetermined breaking layer 4, which path connects the external electrodes 8a, 8b to one another and thus leads to a short circuit.

FIG. 2B shows an excerpt from a piezoactuator 1 in accordance with FIG. 1B, in which a crack has originated within a predetermined breaking layer 4 and has propagated over the entire cross-sectional area of the predetermined breaking layer 4. In this way, the piezoactuator 1 is divided into two partial stacks 1a, 1b, which can be displaced relative to one another. This leads to an intensified mechanical stressing of the enclosure 10 of the piezoactuator 1, which can lead to tearing of the enclosure 10.

FIGS. 3A to 3F, 4, 5 and 6A to 6G show exemplary embodiments of predetermined breaking layers 4 which are configured inhomogeneously laterally. The origination of conductive paths, as shown in FIG. 2A, or the origination of a segmentation of the piezoactuator 1, as shown in FIG. 2B, can be prevented or made more difficult by such an inhomogeneous configuration.

The predetermined breaking layer 4 has at least one partial region 5a which differs from a further region 4a of the predetermined breaking layer 4 with regard to its chemical or physical properties. In this case, the subdivision of the predetermined breaking layer 4 into at least one partial region 5a and a further region 4a runs in a plane perpendicular to the stacking direction S. By way of example, a barrier region 5 contains a partial region 5a in order thus to impede the propagation of cracks and of electrically conductive paths over the cross-sectional area of the predetermined breaking layer 4 through the partial region 5a.

In FIGS. 3A to 3F, the predetermined breaking layers 4 have a barrier region 5 with a partial region 5a, in which the formation of electrically conductive paths or the formation of cracks is impeded to a greater extent than in a further region 4a of the predetermined breaking layer 4. The further region 4a contains a porous material. The partial region 5a contains the same material as the adjoining piezoelectric layers 2a, 2c. In particular, the porosity of the material in the partial region 5a and in the adjoining piezoelectric layers 2a, 2c is identical and the porosity of the material in the further region 4a of the predetermined breaking layer 4 is greater than in the partial region 5a. Hereinafter, the term "porous material" denotes a material whose porosity is higher than the porosity of adjoining layers of the stack. By way of example, both the partial region 5a and the further region 4a contain a ceramic material.

The partial region 5a, on account of its lower porosity, has a higher average strength than the further region 4a of the predetermined breaking layer 4. As a result, both the origination of conductive paths and the segmentation of the piezoactuator 1 can be prevented.

FIG. 3A shows a predetermined breaking layer 4 in which the barrier region 5 is arranged in a region between the two inactive zones 6a, 6b. The barrier region 5 extends over the entire diagonal 90 of the predetermined breaking layer 4, which runs transversely with respect to the inactive zones 6a, 6b, that is to say perpendicularly to a connecting line between the inactive zones 6a, 6b. In this way, within the predetermined breaking layer 4, each connecting line between the external electrodes 8a, 8b passes through the barrier region 5. As a result, it is possible, for example, to prevent the formation of an electrically conductive path that electrically interconnects the external electrodes 8a, 8b, which are arranged at the edge of the piezoactuator in the region of the inactive zones 6a, 6b. Moreover, it is possible to prevent the origination of a crack that connects the external electrodes 8a, 8b to one another. In the further region 4a, in which the inactive zones 6a, 6b are also situated, the predetermined breaking layer 4 contains a porous material that is configured in an optimized manner with regard to crack formation and crack guiding.

FIG. 3B shows a further embodiment of the arrangement of a barrier layer 5 in a predetermined breaking layer 4, wherein, in contrast to FIG. 3A, the barrier layer 5 does not extend along the diagonal 90, but rather connects two side areas of the piezoactuator 1. In this case, too, each connecting line between the external electrodes 8a, 8b and hence also each connecting line between the inactive zones 6a, 6b passes within the predetermined breaking layer 4 through the barrier region 5.

FIG. 3C shows a further embodiment of a predetermined breaking layer 4, with a partial region 5a in the barrier region 5. In this case, too, the partial region 5a is embodied in such a way that, within the predetermined breaking layer 4, each connecting line between the external electrodes 8a, 8b passes through the partial region 5a. The partial region 5a forms a continuous sinuous path extending over the diagonal 90 of the predetermined breaking layer 4. The material of the further region 4a of the predetermined breaking layer 4 extends in a finger-like manner into the barrier region 5 and is intermeshed with the partial region 5a. Mechanical stresses of the piezoactuator 1 can be compensated for particularly well in this way.

FIG. 3D shows an embodiment of the predetermined breaking layer 4 in which circular islands 5b composed of porous material are situated in the barrier region 5. The islands 5b are surrounded by the partial region 5a of the barrier region 5. Within the islands 5b, cracks can originate in the piezoactuator 1 in a targeted manner.

FIG. 3E shows an embodiment of the predetermined breaking layer 4 in which rectangular islands 5b composed of porous material are situated in the barrier region 5.

Instead of the circular and rectangular islands shown in FIGS. 3D and 3E, such islands can also have any other shape.

FIG. 3F shows an embodiment of the predetermined breaking layer 4 in which porous material forms a continuous path 5c in the barrier region 5. The continuous path 5c is longer than that section of each connecting straight line between the external electrodes 8a, 8b which lies in the barrier region 5. This decreases the probability of penetrating moisture giving rise to an electrically conductive path that leads completely through the barrier region 5 and can thus connect the external electrodes 8a, 8b. In addition thereto, a segmentation of the piezoactuator 1 can be prevented.

In the embodiments of the predetermined breaking layer 4 as shown in FIGS. 3A to 3F, the diagonal 90 running transversely through the predetermined breaking layer 4 with respect to the inactive zones 6a, 6b intersects both the partial region 5a of the barrier region 5 and the further region 4a of the predetermined breaking layer 4. This can contribute to the reduction of mechanical stresses in the piezoactuator 1.

FIG. 4 shows a predetermined breaking layer 4 with a barrier region 5. The barrier region 5 extends along a diagonal 90 of the predetermined breaking layer 4 and contains a material that is less porous than the material of a further region 4a of the predetermined breaking layer 4, but is more porous than adjoining piezoelectric layers. Penetration of moisture into the barrier region 5 can be impeded in this way. Moreover, the origination of cracks in the barrier region 5 can be made more difficult and a segmentation of the piezoactuator 1 can thus be prevented. In the barrier region 5, too, the tear strength is reduced by comparison with adjoining piezoelectric layers. In the inactive zones 6a, 6b, the predetermined breaking layer 4, on account of its higher porosity, has a reduced tear strength and is thus optimized in the inactive zones 6a, 6b with regard to its crack formation and crack guiding capability.

FIG. 5 shows a further embodiment of a predetermined breaking layer 4, in which additives 7 are introduced into the barrier region 5. The predetermined breaking layer 4 consists of a porous material. In the barrier region 5, the pores are largely filled by the additives 7, and the penetration of moisture into the barrier region 5 is thus impeded. In addition or as an alternative thereto, such additives 7 can lead to an increased tear strength of the barrier region 5. In an alternative embodiment, the additives 7 can also be introduced only into the edge region of the predetermined breaking layer 4, such that the barrier region 5 is arranged in the edge region.

FIGS. 6A to 6G show further examples of structured predetermined breaking layers 4 having at least one partial region 5a which differs from a further region in its chemical or physical properties. The partial region 5a is, for example, part of a barrier region 5 that limits the formation of conductive paths or of cracks within the predetermined breaking layer 4. In contrast to the embodiments shown in FIGS. 3A to 3F, here the barrier region 5 does not extend over the entire diagonal 90.

FIG. 6A shows a predetermined breaking layer 4 with a partial region 5a which has a rectangular form and extends principally along the diagonal 90 of the predetermined breaking layer 4. In contrast to the exemplary embodiment of a barrier region 5 as shown in FIG. 3A, here the barrier region does not extend as far as the corners of the predetermined breaking layer 4.

FIG. 6B shows a predetermined breaking layer 4 with two partial regions 5a, which principally run along the diagonal 90 and in this case, in particular, in the corners of the predetermined breaking layer 4 which are not associated with the inactive zones 6a, 6b. The two partial regions 5a are separated from one another by a bridge 5d in the center. The bridge 5d contains the material of a further region 4a of the predetermined breaking layer 4 and therefore has a reduced tear strength in comparison with the partial regions 5a.

FIG. 6C shows an exemplary embodiment of a predetermined breaking layer 4 in which partial regions 5a extend in bar-type fashion along the diagonal 90. The partial regions 5a are separated from one another by bridges 5d composed of porous material.

FIG. 6D shows a predetermined breaking layer 4 containing a partial region 5a embodied in a rectangular fashion, similar to that in FIG. 6A. Here, however, the partial region 5a is interrupted by circular islands 5b composed of porous material.

FIG. 6E shows an embodiment of the predetermined breaking layer 4 in which the partial region 5a has a similar geometry to the partial region 5a shown in FIG. 6B. Here, however, the partial region 5a is interrupted by rectangular islands 5b composed of porous material.

FIG. 6F shows an embodiment of the predetermined breaking layer 4 in which the partial region 5a, as in FIG. 3B, does not extend along the diagonal 90, but rather is arranged parallel to the external electrodes 8a, 8b. Here, however, the partial region 5a does not extend as far as the side areas. The partial regions shown in FIGS. 6A to 6E and 6G can also have such a direction of extent.

FIG. 6G shows an embodiment of the predetermined breaking layer 4 in which the partial region 5a has an elliptical contour. The longitudinal axis of the partial region 5a extends along the diagonal 90.

The forms of the partial regions 5a and barrier regions 5 described here are not restricted to the geometries shown here. Thus, by way of example, the boundary between the barrier region 5 and the further region 4a of the predetermined breaking layer 4 can also have a curved profile instead of a rectilinear profile. Moreover, the barrier region can run not just diagonally, as shown in FIG. 3A, or parallel to the side areas of the piezoactuator, as shown in FIG. 3B, but can also have some other orientation.

FIG. 7 shows a further embodiment of a predetermined breaking layer 4, in which a barrier region 5 which impedes the formation of electrically conductive paths leading through the barrier region extends over the entire predetermined breaking layer 4. Additives 7 that make it more difficult for moisture to penetrate into the predetermined breaking layer 4 are introduced into the predetermined breaking layer 4.

The invention is not restricted to the exemplary embodiments by the description on the basis of the exemplary embodiments, but rather encompasses any novel feature and also any combination of features. This includes, in particular, any combination of features in the patent claims, even if this feature or this combination itself is not explicitly specified in the patent claims or exemplary embodiments.

What is claimed is:

1. A piezoactuator comprising:
   a stack of piezoelectric layers and electrode layers arranged therebetween,
   a predetermined breaking layer which has at least in part a lower tear strength than adjoining piezoelectric layers,
   wherein the predetermined breaking layer has a barrier region, in which formation of electrically conductive paths leading through the barrier region or formation of cracks leading through the barrier region is impeded.

2. The piezoactuator according to claim 1, wherein at least one partial region of the barrier region is provided in which the formation of electrically conductive paths or the formation of cracks is impeded to a greater extent than in a further region of the predetermined breaking layer.

3. The piezoactuator according to claim 1, wherein the predetermined breaking layer has at least in part a greater average porosity than an adjoining piezoelectric layer.

4. The piezoactuator according to claim 2, wherein the partial region of the barrier region has a lower average porosity than the further region of the predetermined breaking layer.

5. The piezoactuator according to claim 1, wherein at least one inactive zone is formed between two electrode layers of different polarities that are adjacent in a stacking direction, in which the at least one inactive zone the electrode layers do not overlap in the stacking direction, and
   wherein the barrier region is situated outside the inactive zone.

6. The piezoactuator according to claim 1, further comprising two external electrodes that electrically connect the electrode layers of one polarity to one another,
   wherein, in the predetermined breaking layer, a connecting line between the external electrodes passes through the barrier region.

7. The piezoactuator according to claim 6
   wherein at least one partial region of the barrier region is provided in which the formation of electrically conductive paths or the formation of cracks is impeded to a greater extent than in a further region of the predetermined breaking layer,
   wherein the barrier region has a continuous path, in which the tear strength is lower than in the partial region of the barrier region, and
   wherein the continuous path is longer than that section of each straight line connecting the external electrodes which lies in the barrier region.

8. The piezoactuator according to claim 6
   wherein at least one partial region of the barrier region is provided in which the formation of electrically conductive paths or the formation of cracks is impeded to a greater extent than in a further region of the predetermined breaking layer,
   wherein the partial region of the barrier region is formed in such a way that, in the predetermined breaking layer, each connecting line between the external electrodes passes through the partial region of the barrier region.

9. The piezoactuator according to claim 2, wherein the partial region of the barrier region surrounds islands having a lower tear strength than the partial region.

10. The piezoactuator according to claim 2, wherein the partial region of the barrier region contains the same material as an adjoining piezoelectric layer.

11. The piezoactuator according to claim 1, wherein the predetermined breaking layer contains a ceramic and/or a metal.

12. The piezoactuator according to claim 1, wherein the predetermined breaking layer is embodied inhomogeneously in a plane perpendicular to a stacking direction of the stack.

13. The piezoactuator according to claim 1, wherein additives that impede the formation of electrically conductive paths or the formation of cracks are situated in the barrier region.

14. The piezoactuator according to claim 1, wherein the barrier region is arranged at least in an outer edge region of the predetermined breaking layer.

15. The piezoactuator according to claim 13, wherein the barrier region that impedes the formation of electrically conductive paths leading through the barrier region extends over the entire predetermined breaking layer.

* * * * *